United States Patent
Chen et al.

(10) Patent No.: US 12,504,241 B2
(45) Date of Patent: Dec. 23, 2025

(54) NUCLEATE BOILING APPARATUS

(71) Applicant: Quanta Computer Inc., Taoyuan (TW)

(72) Inventors: Chao-Jung Chen, Taoyuan (TW);
Yu-Nien Huang, Taoyuan (TW);
Herman Tan, Taoyuan (TW);
Tien-Juei Chuang, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 1056 days.

(21) Appl. No.: 17/505,109

(22) Filed: Oct. 19, 2021

(65) Prior Publication Data
US 2023/0071055 A1 Mar. 9, 2023

Related U.S. Application Data

(60) Provisional application No. 63/260,826, filed on Sep. 1, 2021.

(51) Int. Cl.
*F28F 13/18* (2006.01)
*F28D 15/02* (2006.01)

(52) U.S. Cl.
CPC ........ *F28F 13/187* (2013.01); *F28D 15/0275* (2013.01)

(58) Field of Classification Search
CPC ..... F28F 13/187; H05K 7/203; F28D 15/0275
See application file for complete search history.

(56) References Cited

U.S. PATENT DOCUMENTS

| 10,952,354 B1 | 3/2021 | Chen et al. | |
|---|---|---|---|
| 2010/0263835 A1* | 10/2010 | Wang | F28D 15/04 165/104.26 |
| 2015/0043167 A1* | 2/2015 | Guenin | H01L 23/427 361/719 |
| 2016/0227672 A1* | 8/2016 | Lin | H05K 7/20254 |

FOREIGN PATENT DOCUMENTS

| CN | 104969021 A | 10/2015 |
| TW | 201512624 A | 4/2015 |
| TW | M610096 U | 4/2021 |

OTHER PUBLICATIONS

TW Office Action for Application No. 111109826, mailed May 30, 2023 w/ First Office Action Summary.
TW Search Report for Application No. 111109826, mailed May 30, 2023, w/ First Office Action.

* cited by examiner

*Primary Examiner* — Jianying C Atkisson
*Assistant Examiner* — Khaled Ahmed Ali Al Samiri
(74) *Attorney, Agent, or Firm* — NIXON PEABODY LLP

(57) ABSTRACT

A nucleate boiling apparatus is disclosed that includes a base configured to fit onto a heat-producing object to provide immersion cooling to the object in a liquid-cooled computing environment. The apparatus further includes first and second pluralities of pipes extending from opposite sides of the base. Each of the first and second pluralities of pipes including a respective transition region and a respective flat region. The first and second pluralities of pipes in the transition regions extend away and up from the base, and the first and second pluralities of pipes in the flat regions extend away from the base in a fanned-out arrangement. The flat region of the second plurality of pipes is at a greater distance from the base than the flat region of the first plurality of pipes.

18 Claims, 3 Drawing Sheets

NUCLEATE BOILING APPARATUS

CROSS-REFERENCE TO RELATED APPLICATIONS

This application claims priority under 35 U.S.C. § 119 to and the benefit of U.S. Provisional Patent Application Ser. No. 63/260,826, filed on Sep. 1, 2021, and titled "Undisrupted Multiple Nucleation Sites For Immersion Cooling," which is incorporated herein by reference in its entirety.

FIELD OF THE INVENTION

The present invention relates generally to an apparatus for promoting nucleate boiling for cooling a component that generates heat within a computing system, and more specifically, to a nucleate boiling apparatus that provides for two separate levels of nucleate boiling sites.

BACKGROUND OF THE INVENTION

Two-phase boiling heat transfer is a state-of-art thermal solution for dense power components within computing systems. The latent heat of phase change easily dissipates huge amounts of heat while keeping the internal computing temperature at the saturate temperature. FIG. 1 shows this situation, where a nucleate boiling plate 100 is in contact with a component (not shown) within a computing system (not shown) that generates heat. Due to this tremendous heat dissipation performance, boiling heat transfer is considered a game changer of future thermal solutions. However, large heat dissipation with non-uniform distribution causes local hot spots and leads to bubbles merging into a bubble film at a downstream region, which can reduce boiling heat transfer and may cause burn out in some worst cases. The bubble film 101 is shown in FIG. 1 with respect to the nucleate boiling plate 100.

To prevent this problem, and referring to FIG. 2, it is common to utilize an enhanced nucleate boiling plate 200 to make bubble generation more uniform on the surface. Such an enhanced nucleate boiling plate 200 is usually made from a high thermal conductivity material, such as copper, and includes a surface treatment, such as being coated with small particles or punch dimples 202 to enhance nucleate boiling. As shown in FIG. 2, the enhanced nucleate boiling plate 200 successfully makes the vapor bubble formation more uniform on almost all of its surface area, as compared to the nucleate boiling plate 100 of FIG. 1. Yet, it still cannot entirely prevent large distorted vapor bubbles 201 at the center, which affects heat dissipation across the entirety of the enhanced nucleate boiling plate 200.

The present disclosure is directed to providing a nucleate boiling apparatus that solves the above problems and other needs.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to one aspect of the present disclosure, a nucleate boiling apparatus includes a base configured to fit onto a heat-producing object to provide immersion cooling to the object in a liquid-cooled computing environment. The base is defined by a top surface, a bottom surface, and a plurality of side surfaces. The plurality of sides surfaces includes a first side surface and a second side surface. The nucleate boiling apparatus further includes a first plurality of pipes extending from the first side surface. The first plurality of pipes includes a first transition region and a first flat region. The first plurality of pipes in the first transition region extends away from and in a first angled direction relative to the base. The first plurality of pipes in the first flat region extends away from the base in a fanned-out arrangement. The nucleate boiling apparatus further includes a second plurality of pipes extending from the second side surface. The second plurality of pipes includes a second transition region and a second flat region. The second plurality of pipes in the second transition region extends away from and in a second angled direction relative to the base. The second plurality of pipes in the second flat region extends away from the base in a fanned-out arrangement. The second flat region is at a greater distance from the top surface of the base than the first flat region.

According to one embodiment of the above aspect, surfaces of the first plurality of pipes in the first flat region include one or more features that enhance nucleate boiling. According to another embodiment of the above aspect, surfaces of the second plurality of pipes in the second flat region include one or more features that enhance nucleate boiling. According to another embodiment of the above aspect, the first plurality of pipes connects to the second plurality of pipes through the base such that each pipe of the first plurality of pipes connects with a corresponding pipe of the second plurality of pipes to constitute a single pipe. According to another embodiment of the above aspect, the first plurality of pipes is arranged in a single layer. According to another embodiment of the above aspect, the second plurality of pipes is arranged in a single layer. According to another embodiment of the above aspect, the first plurality of pipes comprises eight pipes. According to another embodiment of the above aspect, the second plurality of pipes comprises eight pipes. According to another embodiment of the above aspect, the first plurality of pipes in the first transition region are angled relative to the base at a first angle, and the second plurality of pipes in the second transition region are angled relative to the base at a second angle, and the second angle is different than the first angle. According to another embodiment of the above aspect, a cross section area of each pipe of the first plurality of pipes is larger in the first flat region than in the first transition region. According to another embodiment of the above aspect, the cross section area of each pipe of the first plurality of pipes in the first flat region increases in size farther away from the base. According to another embodiment of the above aspect, a cross section area of each pipe of the second plurality of pipes is larger in the second flat region than in the second transition region. According to another embodiment of the above aspect, the cross section area of each pipe of the second plurality of pipes in the second flat region increases in size farther away from the base. According to another embodiment of the above aspect, all pipes of the first plurality of pipes in the first transition region are parallel to each other. According to another embodiment of the above aspect, all pipes of the second plurality of pipes in the second transition region are parallel to each other. According to another embodiment of the above aspect, outside pipes of the first plurality of pipes in the first flat region are spaced farther apart than inside pipes of the first plurality of pipes. According to another embodiment of the above aspect, outside pipes of the second plurality of pipes in the second flat region are spaced farther apart than inside pipes of the first plurality of pipes. According to another embodiment of the above aspect, each pipe of the first plurality of pipes and the second plurality of pipes are sealed hollow metal pipes containing a working fluid. According to another embodiment of the above aspect, the first plurality of pipes and the second plurality of pipes span less than a width of the base.

According to another aspect of the present disclosure, a computing system is disclosed that includes a processor and a nucleate boiling apparatus. The nucleate boiling apparatus has a base defined by a top surface, a bottom surface, and a plurality of side surfaces. The plurality of side surfaces includes a first side surface and a second side surface. The bottom surface is in contact with or near the processor. The nucleate boiling apparatus further includes a first plurality of pipes extending from the first side surface. The first plurality of pipes includes a first transition region and a first flat region. The first plurality of pipes in the first transition region extends away from and in a first angled direction relative to the base. The first plurality of pipes in the first flat region extends in a first fanned-out arrangement that is perpendicular to the first side surface. The nucleate boiling apparatus further includes a second plurality of pipes extending from the second side surface. The second plurality of pipes includes a second transition region and a second flat region. The second plurality of pipes in the second transition region extends away from and in a second angled direction relative to the base. The second plurality of pipes in the second flat region extends in a second fanned-out arrangement that is perpendicular to the second side surface. The second flat region is at a greater distance from the top surface of the base than the first flat region.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

Figure 1:
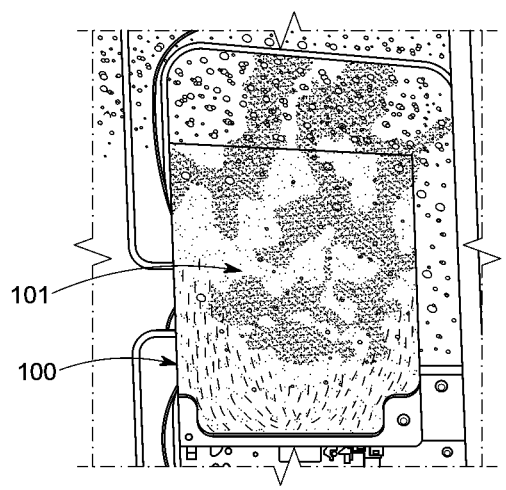
FIG. 1 is a view of a nucleate boiling plate for cooling within a computing system.

While the invention is susceptible to various modifications and alternative forms, specific embodiments have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," "generally," and the like, can be used herein to mean "at," "near," or "nearly at," or "within 3-5% of," or "within acceptable manufacturing tolerances," or any logical combination thereof, for example.

Figure 3A:
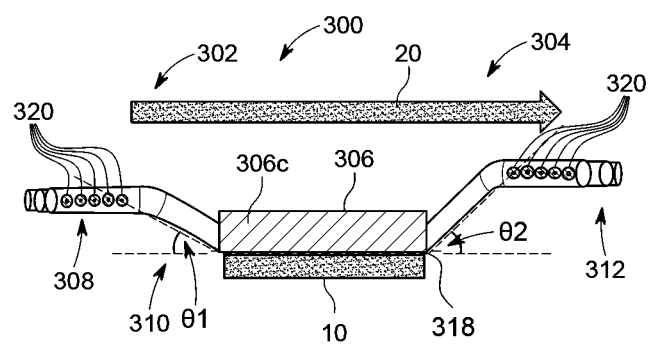
FIG. 3A shows a side view of a nucleate boiling apparatus, according to an aspect of the present disclosure.

FIG. 3A shows a side view of a nucleate boiling apparatus 300, according to an aspect of the present disclosure. The nucleate boiling apparatus 300 includes a first plurality of pipes 302, a second plurality of pipes 304, and a base 306.

The base 306 is configured to fit onto a heat-producing component 10, such as a processor, within a computing system to provide immersion cooling to the component 10 in a liquid-cooled computing environment. The base 306 is defined by a top surface 306a (FIG. 3C), a bottom surface 306b (FIG. 3B), and a plurality of side surfaces 306c-306f. The plurality of side surfaces 306c-306f include a first side surface 306f and a second side surface 306d, opposite the first side surface 306f. The base 306 can be made of a metal or a metal alloy, such as copper or an aluminum alloy. The primary purpose of the base 306 is to retain the first plurality of pipes 302 and the second plurality of pipes 304 generally near or against the component 10. The diamond-hashed region of the base 306 represents where the first plurality of pipes 302 and the second plurality of pipes 304 extend through the base 306 to be in contact with the component 10. In one or more embodiments, the contact can constitute the base 306 and/or the pluralities of pipes 302 and 304 being in direct contact with the component 10. Alternatively, the contact can constitute the base 306 and/or the pluralities of pipes 302 and 304 partially or fully in contact with a thermal interface material 318 that is between the base 306 and the component 10. The thermal interface material 318 can improve the transfer of heat between the base 306 and/or the pluralities of pipes 302 and 304 and the component 10.

The first plurality of pipes 302 extends from the first side surface 306f of the base 306. The first plurality of pipes 302 includes a first flat region 308 and a first transition region 310. The first plurality of pipes 302 in the first transition region 310 extends away from and in a first angled direction relative to the base 306, relative to the orientation shown in FIG. 3A. The first plurality of pipes 302 in the first flat region 308 extends away from the base 306 in a fanned-out arrangement, as shown and described further below with respect to FIGS. 3B and 3C. All of the pipes within the first plurality of pipes 302 in the first transition region 310 are generally parallel to each other.

Similar to the first plurality of pipes 302, the second plurality of pipes 304 extends from the second side surface 306d of the base 306, opposite from the first plurality of pipes 302 and the first side surface 306f. The second plurality of pipes 304 includes a second flat region 312 and a second transition region 314. The second plurality of pipes 304 in the second transition region 314 extends away from and in a second angled direction relative to the base 306, relative to the orientation shown in FIG. 3A. The second plurality of pipes 304 in the second flat region 312 extends away from the base 306 in a fanned-out arrangement, as also as shown and described further below with respect to FIGS. 3B and 3C. All of the pipes within the second plurality of pipes 304 in the second transition region 314 are generally parallel to each other.

Figure 2:
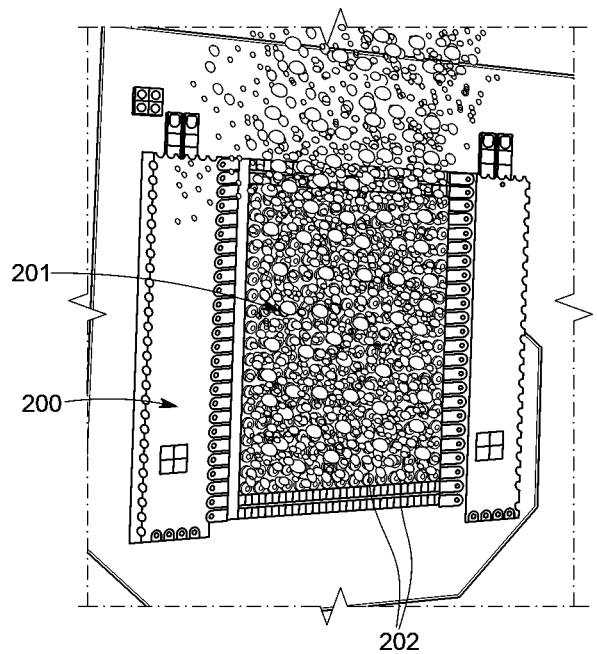
FIG. 2 is a view of an enhanced nucleate boiling plate for cooling within a computing system.

To achieve improved immersion cooling, the second flat region 312 of the second plurality of pipes 304 is at a greater distance from the top surface of the base 306 than the first flat region 308 of the first plurality of pipes 302. The second flat region 312, being farther above the base 306 than the first flat region 308, minimizes the effect that bubbles forming on one of the regions has on the other of the regions. Bubbles that form on one of the regions can pass over or below the other one of the regions to reduce the effect of the bubbles on the opposite region. More specifically, the nucleate boiling apparatus 300 can be positioned on the component 10 within a flow of cooling liquid, designated by the arrow 20, within a computing system. The first plurality of pipes 302 can constitute the upstream region of the nucleate boiling apparatus 300 within the flow of fluid 20. The second plurality of pipes 304 can constitute the downstream region of the nucleate boiling apparatus 300 within the flow of fluid 20. Thus, the first plurality of pipes 302 and the second plurality of pipes 304 are arranged in a staggered manner where the downstream region (e.g., second plurality of pipes 304) is higher than the upstream region (e.g., first plurality of pipes 302) relative to the base 306. The result is that bubble formation at the upstream region affects bubble generation and, therefore, cooling at the downstream region less than if both regions were at the same level. With such a design, both flat regions, in which most of the boiling occurs, become more efficient. Further, the total boiling area can also increase. Therefore, the heat transfer can be significantly improved with the nucleate boiling apparatus 300 as compared to the conventional nucleate boiling plates 100 and 200 (in FIGS. 1, 2 respectively).

In one or more embodiments, the surfaces of the first plurality of pipes 302 in the first flat region 308 can include one or more features described above that enhance nucleate boiling, such as the small particles or punch dimples 320. Similarly, in one or more embodiments, the surfaces of the second plurality of pipes 304 in the second flat region 312 can include one or more features described above that enhance nucleate boiling, such as the small particles or punch dimples 320.

In one or more embodiments, the first plurality of pipes 302 can connect to the second plurality of pipes 304 through the base 306 such that each pipe of the first plurality of pipes 302 connects with a corresponding pipe of the second plurality of pipes 304 to constitute a single pipe. In one or more embodiments, a thermal interface material (e.g., material 318) can be between the base 306 and the component 10.

In one or more embodiments, the first plurality of pipes 302 can be arranged in a single layer, as shown in FIG. 3A. In one or more embodiments, the second plurality of pipes 304 can be arranged in a single layer, as shown in FIG. 3A. Ideally, both the first plurality of pipes 302 and the second plurality of pipes 304 are arranged in single layers to improve nucleation by not having another pipe above or below. However, in one or more embodiments, the first plurality of pipes 302 and the second plurality of pipes 304 can be arranged in more than one layer.

The first plurality of pipes 302 and the second plurality of pipes 304 can include any number of pipes depending on the amount of heat this needs to be dissipated, depending on the size of the base 306, etc. In one or more embodiments, the first plurality of pipes 302 and the second plurality of pipes 304 can both include eight pipes, as shown in FIGS. 3B and 3C.

In one or more embodiments, the first plurality of pipes 302 in the first transition region 310 is angled relative to the base 306 at a first angle θ1 for the first angled direction. The second plurality of pipes 304 in the second transition region 314 are angled relative to the base 306 at a second angle θ2 for the second angled direction. In one or more embodiments, the second angle θ2 can be larger than the first angle θ1 so that the second plurality of pipes 304 can extend to being at a higher level or plane above the first plurality of pipes 302 relative to the base 306 over a shorter distance.

Figure 3B:
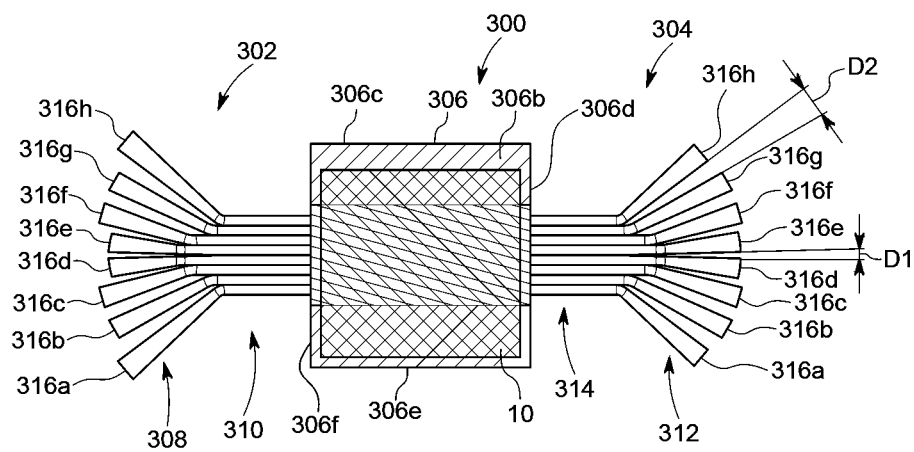
FIG. 3B shows a bottom view of a nucleate boiling apparatus, according to an aspect of the present disclosure.
Figure 3C:
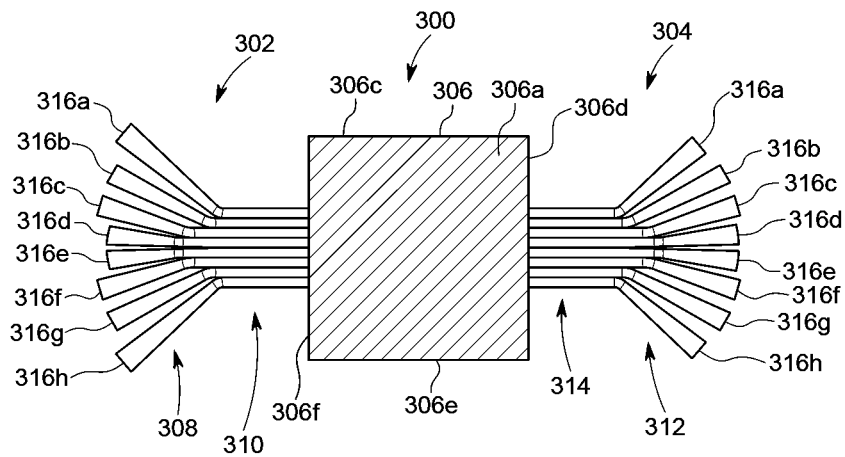
FIG. 3C shows a top view of a nucleate boiling apparatus, according to an aspect of the present disclosure.

FIG. 3B shows a bottom view of the nucleate boiling apparatus 300, and FIG. 3C shows a top view of the nucleate boiling apparatus 300, according to aspects of the present disclosure. For convenience, the embodiment described with respect to FIGS. 3B and 3C is where each pipe of the first plurality of pipes 302 is connected to a corresponding pipe of the second plurality of pipes 304 so as to form single pipes that span the nucleate boiling apparatus 300. Thus, the nucleate boiling apparatus 300 includes eight pipes 316a-316h. Further, the portions of the pipes 316a-316h that are within the first flat region 308 and the second flat region 312 described above are shown fanned out or dispersed. The fanned-out arrangement of the pipes 316a-316h provides for greater clearance between the pipes 316a-316h so that nucleation at one pipe (e.g., 316a) affects the nucleation at a neighboring pipe (e.g., 316b) less than if the pipes 316a-316h were not fanned out.

In one or more embodiments, the spacing between the pipes 316a-316h can be constant, relative to the distance from the base 306. Alternatively, in one or more embodiments, the first plurality of pipes 302 in the first flat region 308, the second plurality of pipes 304 in the second flat region 312, or both are spaced increasingly farther. The spacing can be farther apart relative to the distance from the base 306, relative to the distance from the center pipes, which are the pipes 316d and 316e in the example shown in FIG. 3B, or relative to both distances. Thus, the distance D1 in FIG. 3B is less than the distance D2 in FIG. 3B because pipes 316g and 316h are farther away from the center or midline of the pipes 316a-316h than the pipes 316d and 316e, which generally define the center or midline of the pipes 316a-316h. This again aids nucleation and reduces the combination of bubbles on the outside pipes (e.g., 316a, 316b, 316h, and 316h).

As further shown in FIGS. 3B and 3C, in one or more embodiments, the cross section area of the pipes 316a-316h within the first flat region 308, the second flat region 312, or both are larger than the cross section area of the pipes 316a-316h in the respective first transition region 310, the respective second transition region 314, or both. The larger cross section area of the pipes 316a-316h in the first flat region 308, the second flat region 312, or both provide for additional surface area for nucleation.

Further, in one or more embodiments, and as further shown in FIGS. 3B and 3C, the cross section area of the pipes 316a-316h within the first flat region 308, the second flat region 312, or both increase in size relative to the distance from the base 306. The increase in the cross section area of the pipes 316a-316h relative to the distance from the base 306 further provides for additional surface area for nucleation.

In one or more embodiments, and as shown in FIGS. 3B and 3C, the pipes 316a-316h are sealed hollow metal pipes. In one or more embodiments, the sealed hollow metal pipes can contain a fluid, such as a working fluid, therein. The working fluid can be selected so as to be in both a liquid state and a vapor state within the pipes when the pipes 316a-316h are in use. In one or more embodiments, the pipes 316a-316h can be solid.

In one or more embodiments, the combined widths of the first plurality of pipes 302, the second plurality of pipes 304, or both can span less than the width of the base 306. Alternatively, the combined widths of the first plurality of pipes 302, the second plurality of pipes 304, or both can span generally the same width as the base 306.

Figure 4:
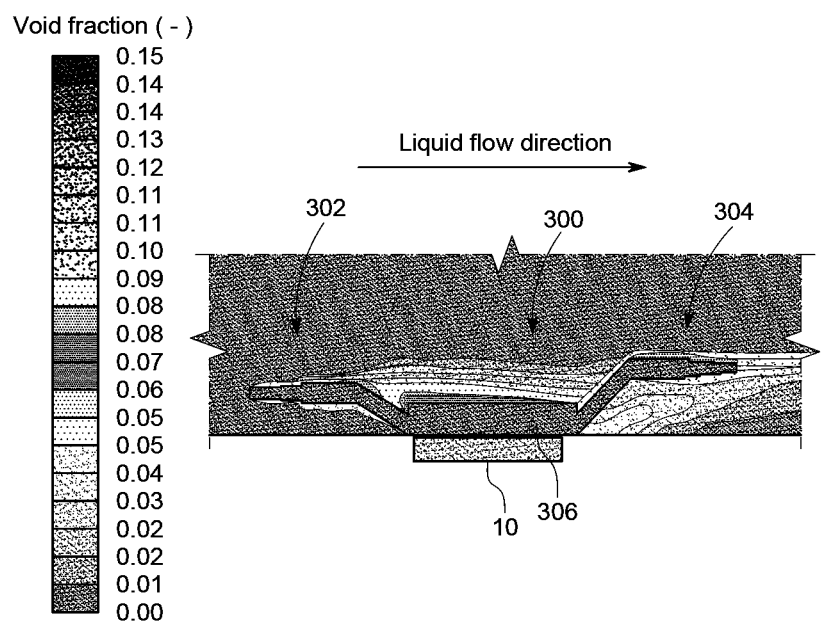
FIG. 4 shows the void fraction distribution from a computational fluid dynamics simulation for a nucleate boiling apparatus, according to an aspect of the present disclosure.
Figure 5:
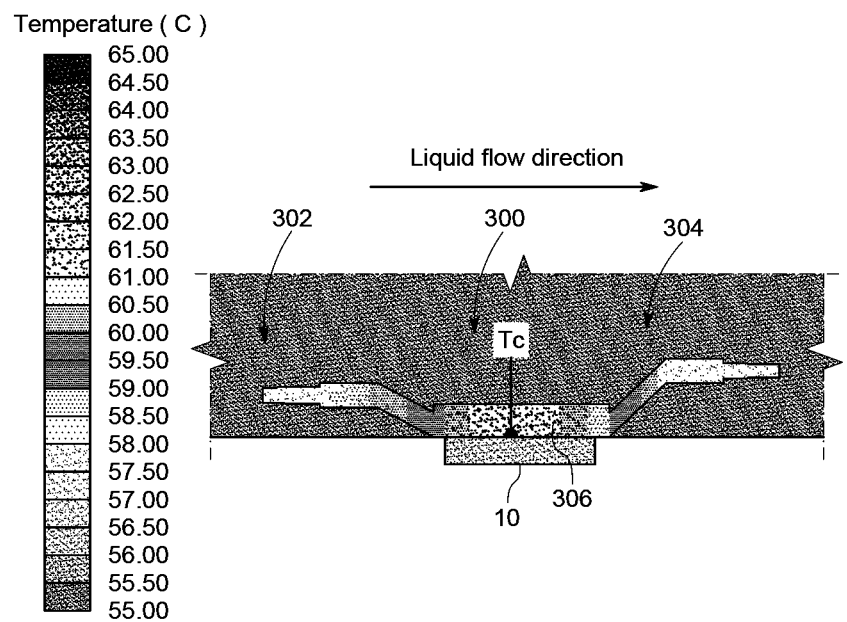
FIG. 5 shows the temperature distribution from computational fluid dynamics simulation for a nucleate boiling apparatus, according to an aspect of the present disclosure.

FIGS. 4 and 5 show computational fluid dynamics simulation results that show the effect of the staggered first plurality of pipes 302 relative to the second plurality of pipes 304 over the base 306 of the nucleate boiling apparatus 300. As FIG. 4 shows, the void fraction is generated at the first plurality of pipes 302 and later is flowing and concentrating above the base 306, but is below the second plurality of pipes 304 downstream from the base 306 and the first plurality of pipes 302, relative to the liquid flow direction. Thus, the nucleate boiling caused by the first plurality of pipes 302 interferes with the nucleate boiling caused by the second plurality of pipes 304 less than if both pluralities of pipes 302 and 304 were on the same plane or level above the base 306.

In reference to FIG. 5, the staggered pluralities of pipes 302 and 304 provide greater heat transfer ability from the component 10 to the surrounding fluid. Table 1 shows that the nucleate boiling apparatus 300 provides better heat dissipation as compared to a conventional nucleate boiling plate (e.g., plate 200 in FIG. 2). The nucleate boiling apparatus 300 can lower thermal resistance as much as 56%. Further, the nucleate boiling apparatus 300 improves the heat transfer ability over a conventional nucleate boiling plate (e.g., plate 200 in FIG. 2) by as much as 80%.

| Item | Conventional Design | Current Design |
|---|---|---|
| Thermal Resistance (C/W) | 0.022 | 0.012 |
| Improvement | N/A | 56% |
| Power (W) | 334 | 600 |
| Improvement | N/A | 80% |

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more embodiments, equivalent alterations and modifications will occur or be known to others skilled in the art upon the reading and understanding of this specification and the annexed drawings. In addition, while a particular feature of the invention may have been disclosed with respect to only one of several embodiments, such feature may be combined with one or more other features of the other embodiments as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A cooling system comprising:
   a liquid-cooled computing environment having a cooling liquid flowing along a flow path from an upstream region to a downstream region; and
   a nucleate boiling apparatus having
   a base positioned in the flow path of the liquid-cooled computing environment and configured to fit onto a heat-producing object, the base being defined by a top surface, a bottom surface, and a plurality of side surfaces, the plurality of sides surfaces including a first side surface positioned in the upstream region and a second side surface positioned in the downstream region;
   a first plurality of pipes extending from the first side surface in the upstream region, the first plurality of pipes including a first transition region and a first flat region, the first plurality of pipes in the first transition region extending away from and in a first angled direction relative to the base, the first plurality of pipes in the first flat region extending away from the base in a first fanned-out arrangement in which two first center pipes are separated by a first distance D1; and
   a second plurality of pipes extending from the second side surface in the downstream region, the second plurality of pipes including a second transition region and a second flat region, the second plurality of pipes in the second transition region extending away from and in a second angled direction relative to the base, the second plurality of pipes in the second flat region extending away from the base in a second fanned-out arrangement,
   wherein the second flat region is at a greater distance from the top surface of the base than the first flat region;
   wherein at least one fanned-out arrangement of the first and second fanned-out arrangements includes two center pipes separated by the distance D1 and two outer pipes separated by a distance D2, the distance D1 being less than the distance D2, the outer pipes including an outside pipe and an adjacent pipe; and
   wherein all pipes of the first plurality of pipes are parallel to each other in the first transition region and non-parallel to each other in the first flat region, all pipes of the second plurality of pipes being parallel to each other in the second transition region and non-parallel to each other in the second flat region.

2. The cooling system of claim 1, wherein one or more (a) surfaces of the first plurality of pipes in the first flat region and (b) surfaces of the second plurality of pipes in the second flat region include one or more features that enhance nucleate boiling.

3. The cooling system of claim 1, wherein one or more (a) surfaces of the first plurality of pipes in the first flat region and (b) surfaces of the second plurality of pipes in the second flat region include punch dimples for enhancing nucleate boiling.

4. The cooling system of claim 1, wherein the first plurality of pipes connects to the second plurality of pipes through the base such that each pipe of the first plurality of pipes connects with a corresponding pipe of the second plurality of pipes to constitute a single pipe.

5. The cooling system of claim 1, wherein the first plurality of pipes is arranged in a single layer.

6. The cooling system of claim 1, wherein the second plurality of pipes is arranged in a single layer.

7. The cooling system of claim 1, wherein the first plurality of pipes comprises eight pipes.

8. The cooling system of claim 7, wherein the second plurality of pipes comprises eight pipes.

9. The cooling system of claim 1, wherein the first angled direction is angled at a different angle than the second angled direction.

10. The cooling system of claim 1, wherein a cross section area of each pipe of the first plurality of pipes is larger in the first flat region than in the first transition region.

11. The cooling system of claim 10, wherein the cross section area of each pipe of the first plurality of pipes in the first flat region increases in size farther away from the base.

12. The cooling system of claim 10, wherein a cross section area of each pipe of the second plurality of pipes is larger in the second flat region than in the second transition region.

13. The cooling system of claim 12, wherein the cross section area of each pipe of the second plurality of pipes in the second flat region increases in size farther away from the base.

14. The cooling system of claim 1, wherein outside pipes of the first plurality of pipes in the first flat region are spaced farther apart than inside pipes of the first plurality of pipes.

15. The cooling system of claim 14, wherein outside pipes of the second plurality of pipes in the second flat region are spaced farther apart than inside pipes of the first plurality of pipes.

16. The cooling system of claim 1, wherein each pipe of the first plurality of pipes connects with a corresponding pipe of the second plurality of pipes to constitute a single sealed hollow metal pipe containing a working fluid.

17. The cooling system of claim 1, wherein the first plurality of pipes and the second plurality of pipes span less than a width of the base.

18. A computing system comprising:
    a liquid-cooled computing environment having a cooling liquid flowing along a flow path from an upstream region to a downstream region;
    a processor positioned in the liquid-cooled computing environment; and
    a nucleate boiling apparatus positioned in the flow path of the liquid-cooled computing environment and in thermal contact with the processor, the nucleate boiling apparatus having
    a base defined by a top surface, a bottom surface, and a plurality of side surfaces, the plurality of side surfaces including a first side surface positioned in the upstream region and a second side surface positioned in the downstream region, the bottom surface being closer to the processor than the top surface;
    a first plurality of pipes extending from the first side surface in the upstream region, the first plurality of pipes including a first transition region and a first flat region, the first plurality of pipes in the first transition region extending away from and in a first angled direction relative to the base, the first plurality of pipes in the first flat region extending in a first fanned-out arrangement that is perpendicular to the first side surface; and
    a second plurality of pipes extending from the second side surface in the downstream region, the second plurality of pipes including a second transition region and a second flat region, the second plurality of pipes in the second transition region extending away from and in a second angled direction relative to the base, the second plurality of pipes in the second flat region extending in a second fanned-out arrangement that is perpendicular to the second side surface, wherein the second flat region is at a greater distance from the top surface of the base than the first flat region; and wherein at least one fanned-out arrangement of the first and second fanned-out arrangements includes two center pipes separated by a distance D1 and two outer pipes separated by a distance D2, the distance D1 being less than the distance D2, the outer pipes including an outside pipe and an adjacent pipe wherein all pipes of the first plurality of pipes are parallel to each other in the first transition region and non-parallel to each other in the first flat region, all pipes of the second plurality of pipes being parallel to each other in the second transition region and non-parallel to each other in the second flat region.

* * * * *